US012224329B2

(12) United States Patent
Banzhaf et al.

(10) Patent No.: US 12,224,329 B2
(45) Date of Patent: Feb. 11, 2025

(54) TRENCH TRANSISTOR (71) Applicant: Robert Bosch GmbH, Stuttgart (DE)

(72) Inventors: Christian Tobias Banzhaf, Laichingen (DE); Jan-Hendrik Alsmeier, Pfullingen (DE); Stephan Schwaiger, Bodelshausen (DE); Wolfgang Feiler, Reutlingen (DE); Dick Scholten, Stuttgart (DE); Klaus Heyers, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 435 days.

(21) Appl. No.: 17/635,823

(22) PCT Filed: Aug. 24, 2020

(86) PCT No.: PCT/EP2020/073626
§ 371 (c)(1),
(2) Date: Apr. 12, 2022

(87) PCT Pub. No.: WO2021/037794
PCT Pub. Date: Mar. 4, 2021

(65) Prior Publication Data
US 2022/0320306 A1    Oct. 6, 2022

(30) Foreign Application Priority Data
Aug. 23, 2019   (DE) ..................... 10 2019 212 646.4

(51) Int. Cl.
*H01L 29/423*  (2006.01)
*H01L 29/16*   (2006.01)
*H01L 29/78*   (2006.01)

(52) U.S. Cl.
CPC .... *H01L 29/42368* (2013.01); *H01L 29/4236* (2013.01); *H01L 29/4238* (2013.01); *H01L 29/1608* (2013.01); *H01L 29/7827* (2013.01)

(58) Field of Classification Search
None
See application file for complete search history.

(56) References Cited

U.S. PATENT DOCUMENTS 8,809,948 B1 *  8/2014  Yilmaz ............... H01L 29/7811
                                                257/334
2005/0017293 A1 * 1/2005  Zundel ............... H01L 29/7813
                                                257/E29.264
(Continued)

FOREIGN PATENT DOCUMENTS

JP    2001015733 A    1/2001
JP    2001358338 A    12/2001
(Continued)

OTHER PUBLICATIONS

International Search Report for PCT/EP2020/073626 Issued Mar. 29, 2021.

*Primary Examiner* — Nishath Yasmeen
(74) *Attorney, Agent, or Firm* — NORTON ROSE FULBRIGHT US LLP; Gerard A. Messina (57) ABSTRACT A trench transistor. The transistor including: a semiconductor region, a trench structure formed in the semiconductor region; a gate insulation layer and an electrically conductive gate layer formed on the gate insulation layer in the trench structure, and a gate contact, which is electrically conductively connected to the gate layer in an edge area of the trench transistor. A thickness of the gate insulation layer in the edge area of the trench transistor is greater than in an active area of the trench transistor.

11 Claims, 5 Drawing Sheets

(56) References Cited

U.S. PATENT DOCUMENTS

| | | | | |
|---|---|---|---|---|
| 2007/0040215 | A1* | 2/2007 | Ma | H01L 29/407 |
| | | | | 257/E29.136 |
| 2007/0155104 | A1* | 7/2007 | Marchant | H01L 29/407 |
| | | | | 257/E29.136 |
| 2008/0073709 | A1* | 3/2008 | Fujimoto | H10B 12/053 |
| | | | | 257/E21.429 |
| 2010/0102382 | A1* | 4/2010 | Shimada | H01L 29/7813 |
| | | | | 438/270 |
| 2012/0261737 | A1* | 10/2012 | Hsieh | H01L 21/823487 |
| | | | | 257/E27.06 |
| 2017/0250256 | A1* | 8/2017 | Siemieniec | H01L 29/0696 |
| 2019/0245033 | A1* | 8/2019 | Chen | H01L 29/0611 |

FOREIGN PATENT DOCUMENTS

| | | |
|---|---|---|
| JP | 2003188379 A | 7/2003 |
| JP | 2005197274 A | 7/2005 |

\* cited by examiner

TRENCH TRANSISTOR

FIELD

The present invention relates to a trench transistor.

BACKGROUND INFORMATION

Conventional trench transistors including a plurality of trenches, which are filled using a gate oxide and a gate poly, each include a radius of curvature on the trench upper side and the trench lower side. The field strength, which drops over the gate oxide during operation, is maximum in the area of the curvature and decreases with increasing radius of curvature. The gate poly is led out of the trench and is electrically connected to a gate path at the edge of the cell field of the trench transistor. One problem of conventional trench transistors arises at the end of the trenches, since the radius of curvature of the trench is reduced there in comparison to an area not located at the end of the trenches, since the end of the trenches is to be designed as a toroid. The maximum field strength in the gate oxide is therefore located at the end of the trenches and limits the usable range of the gate voltage.

SUMMARY

It is an object of the present invention to provide a trench transistor which remedies or at least reduces the above-described problems.

The object may be achieved by a trench transistor according an example embodiment of the present invention. Advantageous refinements of the present invention are disclosed herein.

Trench transistors are described herein, in which an electrically conductive gate layer, for example a highly-doped polysilicon (also referred to as gate poly), which is located as a gate electrode in a trench of the trench transistor and is electrically insulated from a semiconductor region (for example, made of silicon carbide) by a gate insulation layer (for example, a gate oxide), is electrically connected to a gate contact.

The trench transistor having the features of the present invention may have an advantage that an optimized trench structure is provided at an edge area of the trench outside the active cell field, so that a total oxide thickness is increased at the trench end. If a thickness of the gate insulation layer is increased in the edge area of the trench transistor, i.e., if a cross-sectional area of the gate insulation layer increases along a longitudinal direction of a trench extending in the longitudinal direction from an active area of the trench transistor toward an edge area outside the active area, the advantage thus results that the field strength is reduced in the gate insulation layer. Component damage due to excessively high field strength in the gate oxide may thus be avoided.

According to a further aspect of the present invention, it may be provided that the electrically conductive gate layer in the edge area of the trench transistor extends out of the trench structure over the semiconductor region, the electrically conductive gate layer in the trench thus extends at a surface of the trench along a longitudinal direction of the trench and/or transversely to the longitudinal direction beyond the trench. The trench transistor thus designed has the advantage that the electrical contact of the electrically conductive gate layer to a gate contact may be improved.

According to a further aspect of the present invention, it may be provided that the trench transistor includes a second trench structure and a second gate insulation layer in the second trench structure, the electrically conductive gate layer furthermore being formed on the second gate insulation layer in the second trench structure and the thickness of the second gate insulation layer being greater in the edge area of the trench transistor than in the active area of the trench transistor. The trench transistor thus includes a second trench structure which is constructed like the first trench structure, the electrically conductive gate layer forming a shared gate electrode for the first and second trench structure. If the two trenches thus end at an edge area of the cell field of the trench transistor, the electrical potential is thus supplied via the gate contact and the electrically conductive gate layer connected thereto (for example, polysilicon layer) to the particular trench as a gate potential. The advantage results that a total thickness of the gate insulation layer is increased at the end of each trench structure and a radius of curvature is increased, so that a limitation of the usable range of the gate voltage is prevented. In addition to the first and second trench structure, further trench structures, which are constructed similarly, may be provided.

A trench transistor according to a further aspect of the present invention includes, in addition to the first trench structure and a second trench structure, a third trench structure, which is connected with the aid of a connecting structure, for example, a curved trench structure, to the first and second trench structure, a gate insulation layer and an electrically conductive gate layer being provided in the trench structures and the connecting structure, so that an electrical gate potential may be applied from a gate contact via the gate layer in the third trench structure and the connecting structure to the gate electrodes in the first trench structure and second trench structure. In the trench transistor, at least at an edge area of the third trench structure, a width of the third trench structure, thus an extension of the trench perpendicular to the longitudinal direction of the trench, in other words from one trench side wall to the opposite trench side wall of the third trench structure, is greater than a width of the first trench structure and/or the second trench structure. In other words, at least two trenches of a plurality of trenches are brought together at an area outside the cell field of the transistor and end in a wider third trench, which is even farther away from the active area. Due to the greater width of the third trench, it has a greater radius of curvature at its end closer to the gate contact than the at least two trenches which are brought together. The field strength in the gate insulation layer may be reduced by the increased radius of curvature. Therefore, for example, a voltage breakdown through a gate oxide between a gate poly and a silicon carbide may be avoided at a high gate control voltage.

According to a further aspect of the present invention, it may be provided that the width of the third trench, thus a terminus trench, is made sufficiently wide that the gate contact may take place directly in the trench. In this case, for example, it is not necessary to lead the gate layer out of the trench, for example, with the aid of a poly mask level.

According to a further aspect of the present invention, it may be provided that the width of the third trench structure is made sufficiently narrow that the third trench structure may still be filled up using a gate material deposition (for example polysilicon deposition).

According to a further aspect of the present invention, an insulation layer may be provided above the semiconductor region and an electrical through-contact through the insulation layer, which is connected to the gate layer in the third trench structure, thus a via, which leads through the insulation layer on the surface of the semiconductor region and contacts the electrically conductive gate layer. The trench transistor designed in this way has the advantage that a contact of the electrically conductive gate layer to the gate contact may be established without leading the gate layer out of the trench.

According to a further aspect of the present invention, it may be provided that a radius of curvature of the third trench structure in an edge area is greater than a radius of curvature of the first and/or second trench structures in an edge area. This has the advantage that a maximum field strength in the gate insulation layer may be reduced or a field strength at the end of the third trench structure is reduced.

According to a further aspect, it may be provided that the third trench structure is situated on a center line between the first and the second trench structure in an edge area of the trench transistor, the third trench structure is thus aligned in parallel to the first and second trench structure and the third trench structure is positioned spaced apart equal distances from each of the first and second trench structure in an edge area outside the cell field. This has the advantage that a symmetrical arrangement of the trench structures is achieved, so that field strength distributions in the first and second trench structure are essentially identical.

According to a further aspect of the present invention, it may be provided that the third trench structure includes a first area (or section) and a second area (or section), a width of the first area increasing toward the second area up to a width of the second area. The first area may be located closer to the connecting structure than the second area. Starting from an area close to the trench connecting structure, the third trench structure may thus have a (for example continuously) increasing trench cross-sectional area, until a cross-sectional area of the second area of the third trench structure is reached. This has the advantage that a radius of curvature of the trench structure increases (for example continuously) toward an edge area of the third trench structure, so that the field strength may be reduced in the gate insulation layer in the edge area.

According to a further aspect of the present invention, it may be provided that a longitudinal direction of the third trench structure is parallel to a longitudinal direction of the first and second trench structures and the third trench structure extends in extension of the first trench structure or the second trench structure outside the cell field. In other words, the transistor is configured in such a way that the first trench structure or the second trench structure is provided on an identical axis as the third trench structure. This has the advantage that at a transition of the first trench structure or the second trench structure to the third trench structure, small radii of curvature are avoided. It may also be provided that the third trench structure extends in extension of the first trench structure, and furthermore a fourth trench structure is provided, which extends in extension of the second trench structure.

According to a further aspect of the present invention, it may be provided that the electrically conductive gate layer completely fills up the third trench structure above the gate insulation layer and extends out of the third trench structure over the semiconductor region, thus an inner area of the third trench structure is completely filled using the electrically conductive gate layer. This has the advantage that a large electrically conductive cross-sectional area is provided, with the aid of which a contact to the gate contact may be established.

According to a further aspect of the present invention, the width of the third trench structure may be at least 1.5 µm.

According to a further aspect of the present invention, the third trench structure may be completely filled using polysilicon (polysilicon on insulating gate oxide).

A trench structure according to a further aspect of the present invention includes a trough at an edge area of the first and second trench structure, thus a basin-shaped structure including a wall area and a wide base surface, whose surface is positioned at the base height of the first and second trench structure. The wall area encloses the base surface and extends away from the base surface. The trench structures are thus connected at the terminus to a wide terminus trench or trough. This wide trough may be completely filled using polysilicon. This has the advantage that a large-area trench terminus structure having large radii of curvature is provided.

A trench transistor according to a further aspect of the present invention is designed in such a way that a width of a trench structure in an edge area of the trench transistor is greater than in an active area of the trench transistor, the electrical contacting of the electrically conductive gate layer taking place in the edge area of the trench structure. A cross-sectional area of the trench structure thus increases perpendicular to a longitudinal direction of the trench structure. Due to the widening of the trench toward the edge area, the radius of curvature of the trench may in turn be increased in the edge area, by which the field strength in the gate dielectric may be reduced.

According to a further aspect of the present invention, it may be provided that the width of the trench structure increases continuously, thus steadily, toward the edge area from a starting width to an end width.

According to a further aspect of the present invention, the gate insulation layer may include a first sublayer and may include a second sublayer in addition to the first sublayer in an edge area of the trench transistor. According to a further aspect, the first sublayer may have a thickness in a range from approximately 20 nm to 100 nm. According to a further aspect, the second sublayer may have a thickness in a range of approximately 10 nm to 400 nm, preferably approximately 20 nm to 400 nm.

According to a further aspect of the present invention, the trench transistor may be a MOSFET, for example, a silicon carbide MOSFET. The trench transistor may be a power transistor.

According to a further aspect of the present invention, the semiconductor region may include a layer structure customary for vertical transistors, for example, power transistors.

A method for manufacturing a trench transistor in accordance with an example embodiment of the present invention and described herein may include, for example: manufacturing implanted areas in a wafer, for example, a silicon carbide wafer, and activating the implantations according to customary methods; applying the trench structure(s) described herein with the aid of a first mask level and suitable etching methods; post-treating and/or rounding the trench structure(s), for example, by way of high-temperature steps; in the case of the gate oxide thickening (in general, thickening of the gate insulation layer): conformally depositing an oxide and structuring the oxide layer using a second mask level, in such a way that the remaining oxide layer remains in existence at least at an edge area of the trench structure outside the active cell field; depositing a gate insulation layer, for example a gate oxide, and an electrically conductive layer, for example a gate poly; structuring the electrically conductive gate layer with the aid of a third mask level, so that the electrically conductive gate layer remains in existence in the trench structure(s) and in areas outside the trench structure(s) defined with the aid of the third mask level, depositing an insulation material (for example, insulation oxide) and structuring it in a source area of the transistors; manufacturing ohmic source contacts; opening at least one gate contact with the aid of a fourth mask level, in such a way that the insulation material (for example insulation oxide) is removed in areas defined by the fourth mask level, in which the gate contact(s) is/are to be formed; applying at least one metallization and at least one passivation according to customary methods; manufacturing a rear side electrode according to customary methods.

The aspects described herein may each be combined with the further aspects described herein.

Exemplary embodiments of the present invention are illustrated in the figures and explained in greater detail in the following description.

DETAILED DESCRIPTION OF EXAMPLE EMBODIMENTS

In the following detailed description, reference is made to the figures, which form a part of this description and in which specific embodiments are shown for illustration, in which the present invention may be implemented. Other specific embodiments may be used and structural or logical modifications may be carried out without departing from the scope of protection of the present invention. The features of the different specific embodiments described herein may be combined with one another, if not specifically indicated otherwise. The following detailed description is therefore not to be interpreted restrictively.

Figure 1:
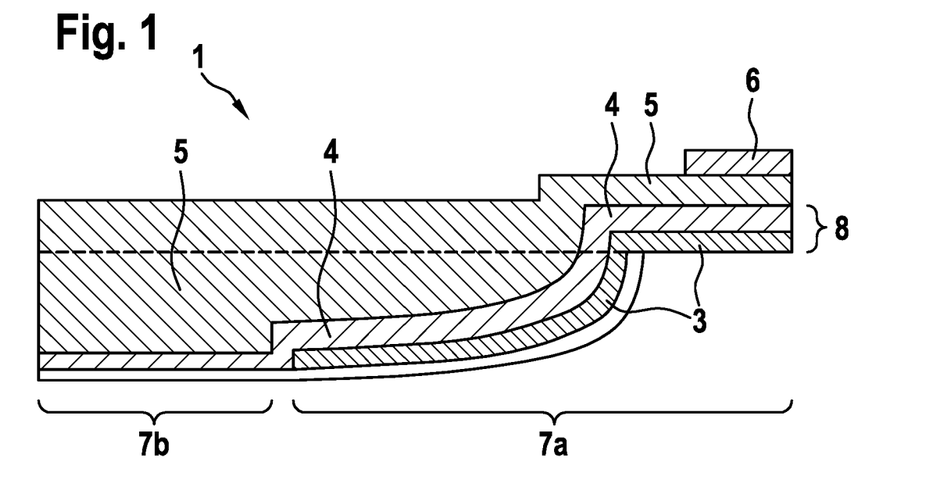
FIG. 1 schematically shows a sectional view of a trench structure of a trench transistor according to one specific embodiment of the present invention.

FIG. 1 schematically shows a trench structure 1 of a trench transistor in longitudinal section. A first gate insulation layer 3, which is provided on a base area of trench structure 1, and an additional second gate insulation layer 4, which is provided on first gate insulation layer 3, having a total thickness 8 in a range of 20 nm to 600 nm are provided in an edge area 7a of trench structure 1, first gate insulation layer 3 being provided for thickening second gate insulation layer 4 in edge area 7a. Second gate insulation layer 4 is provided, for example, as a gate oxide. Layer 3 may include an oxide. Alternatively, first gate insulation layer 3 may include a different material than second gate insulation layer 4. First gate insulation layer 3 is provided in edge area 7a, preferably at the edge of the cell field of a transistor, and overlaps the end of the trench and partially extends to below a gate contact 6 (for example, gate pad) in the longitudinal direction of trench structure 1. Second gate insulation layer 4 overlaps the end of the trench structure in the longitudinal direction of trench structure 1 and partially extends to below gate contact 6. Second gate insulation layer 4 extends in an active area 7b of the trench transistor and may have a thickness in a range of approximately 10 nm to approximately 100 nm. An electrically conductive gate layer 5, for example, a polysilicon layer, is provided on second gate insulation layer 4, which fills trench structure 1 and extends up to gate contact 6 and contacts it. An electrical potential applied with the aid of gate contact 6 is conducted with the aid of electrically conductive gate layer 5 to trench structure 1, a section of electrically conductive gate layer 5 in active area 7b of the trench transistor being used for illustration as the gate electrode of the transistor. The total thickness of the insulation at the trench end increases due to additional insulation layer (for example, oxide layer) 3 in edge area 7a of the transistor and a field strength in the gate insulation (for example, gate oxide) is reduced.

According to a further aspect, first gate insulation layer 3 may extend in a longitudinal direction of trench structure 1 from active area 7b over edge area 7a to gate contact 6. Second gate insulation layer 4 may only extend in edge area 7a to gate contact 6. In this case, second gate insulation layer 4 is used to thicken first gate insulation layer 3 in edge area 7a.

According to a further aspect, instead of first and second gate insulation layer 3, 4, a single gate insulation layer may be provided, which is made thicker in edge area 7a.

Figure 2:
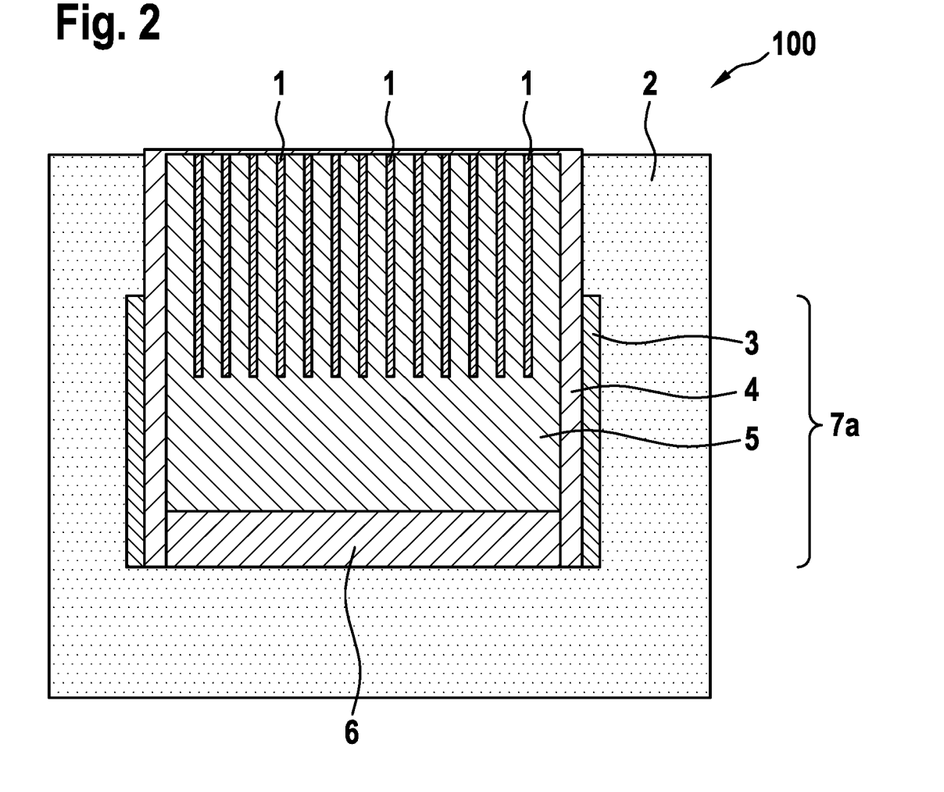
FIG. 2 schematically shows a top view of a trench transistor according to a first specific embodiment of the present invention.

FIG. 2 schematically shows a top view of a trench transistor 100. Transistor 100 includes a plurality of trench structures 1 in a semiconductor region 2, a first and second gate insulation layer 3, 4, an electrically conductive gate layer 5 located above them, and a gate contact 6. It is apparent in FIG. 2 that the thickening of the gate insulation (for example, oxide thickening) by formation of two gate insulation layers 3, 4 is only provided in an edge area 7a of transistor 100, while only gate insulation layer 4 is formed in an active area of transistor 100.

Figure 3:
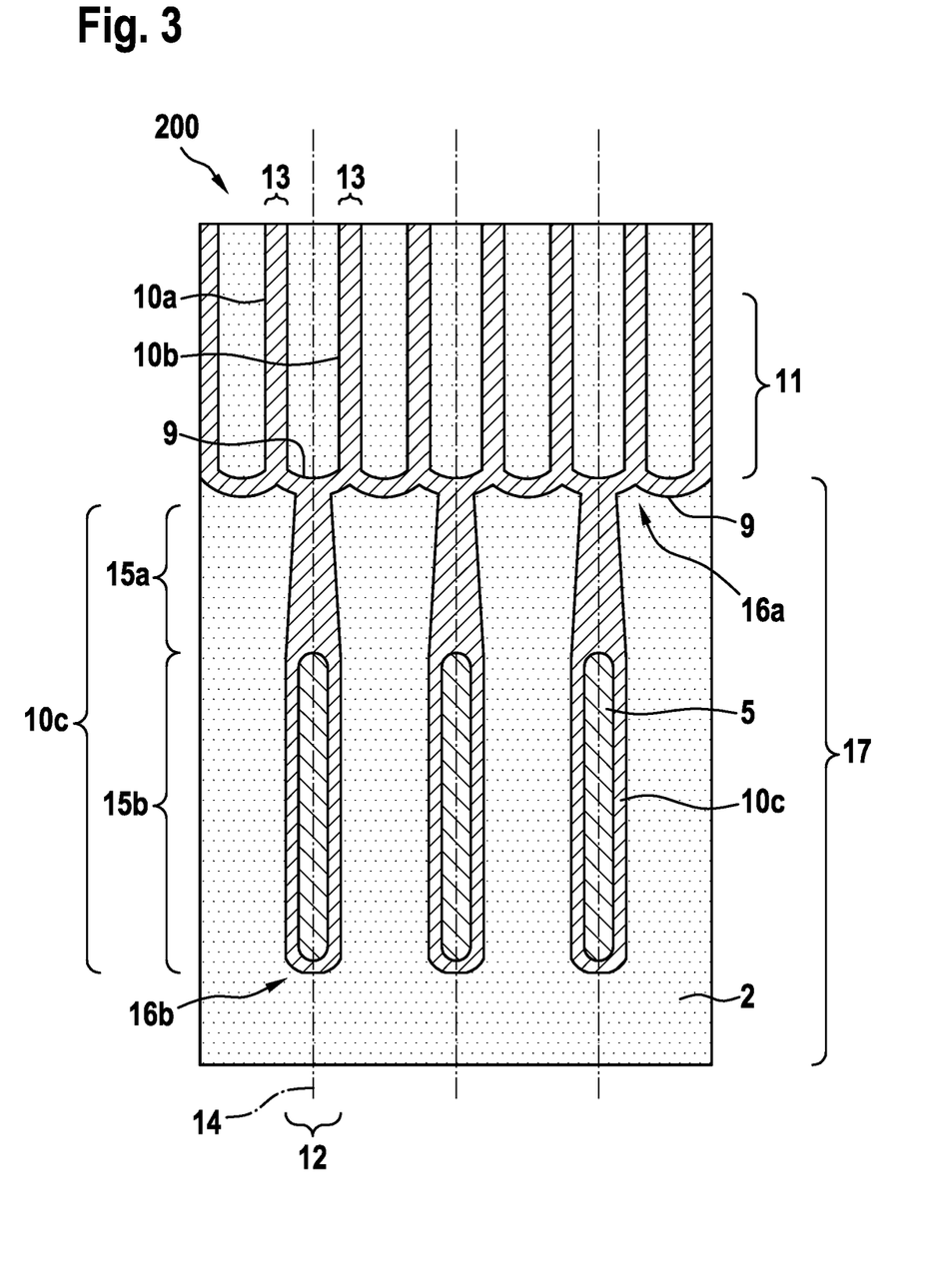
FIG. 3 schematically shows a top view of a trench transistor according to a second specific embodiment of the present invention.

FIG. 3 schematically shows a top view of a trench transistor 200. At least a first trench structure 10a and a second trench structure 10b are provided in a semiconductor region 2, which are connected to one another at an edge area 11 of trench structures 10a, 10b with the aid of a trench connecting structure 9. Trench connecting structure 9 is furthermore connected to a third trench structure 10c in an edge area 17 of transistor 200. A gate insulation layer (not shown, see, for example, layer 3 and/or 4 in FIG. 1 or 2) and an electrically conductive layer 5 are provided in trench structures 10a, 10b, 10c and in trench connecting structure 9. Third trench structure 10c is provided on a center line 14 between first trench structure 10a and second trench structure 10b and extends in parallel to first and second trench structure 10a, 10b. A first area 15a is formed in such a way that a width or a trench cross section of third trench structure 10c in area 15a increases in the direction toward an edge area 15b of third trench structure 10c up to a width 12, and thus ends in a wider edge area 15b of third trench structure 10c in comparison to first and second trench structure 10a, 10b. Due to the increase of a radius of curvature 16a of first or second trench structure 10a, 10b toward a radius of curvature 16b of third trench structure 10c at the end of third trench structure 10c, a field strength is reduced in the gate insulator (for example, gate oxide).

According to a further aspect, the width of third trench structure 10c may be provided sufficiently wide that a gate contact (not shown, see, for example, gate contact 6 in FIG. 1 or 2) takes place directly in third trench structure 10c. On the other hand, a trench width may be selected to be sufficiently narrow that third trench structures 10c are still filled by a polysilicon deposition. Electrically conductive gate layer 5 in third trench structures 10c is electrically conductively connected to the gate contact.

According to a further aspect, trench transistor 200 may optionally be combined with the above-described oxide thickening in third trench structure 10c for an optimized protective effect.

Figure 4:
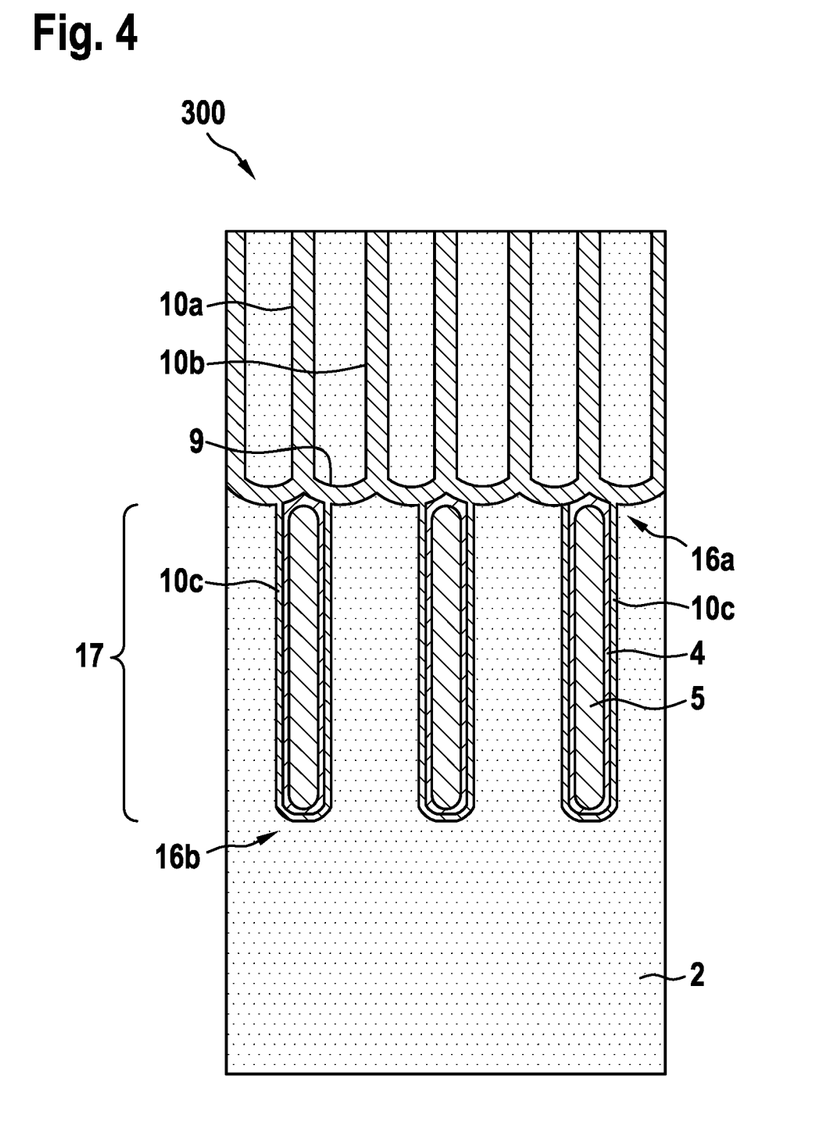
FIG. 4 schematically shows a top view of a trench transistor according to a third specific embodiment of the present invention.

FIG. 4 schematically shows a top view of a trench transistor 300. In trench transistor 300, a plurality of first and second trench structures 10a, 10b are connected with the aid of a trench connecting structure 9 to third trench structures 10c in semiconductor region 2. In first, second, and third trench structure 10a, 10b, 10c and in trench connecting structure 9, an insulation layer (not shown, see, for example, layer 3 or 4 in FIG. 1 or 2) and electrically conductive gate layer 5 are provided. Third trench structures 10c are provided in such a way that they are each provided along a longitudinal direction of first and second trench structures 10a, 10b in extension of first trench structures 10a in an edge area 17. A width of third trench structure 10c is increased in comparison to a width of first and/or second trench structures 10a, 10b. Third trench structure 10c has, for example, a width greater than 1.5 μm and may be filled completely using electrically conductive layer 5, for example, a polysilicon. The contacting of electrically conductive gate layer 5 by a gate contact (not shown, see, for example, contact 6 in FIG. 1 or 2) takes place in the area of wide third trench structure 10c. Due to the increase of radius of curvature 16a of first or second trench structure 10a, 10b in relation to radius of curvature 16b of third trench structure 10c at the end of third trench structure 16b, a field strength in the gate insulator (for example, gate oxide) is reduced.

According to a further aspect, trench transistor 300 may optionally be combined with the above-described oxide thickening in third trench structure 10c for an optimized protective effect.

Figure 5:
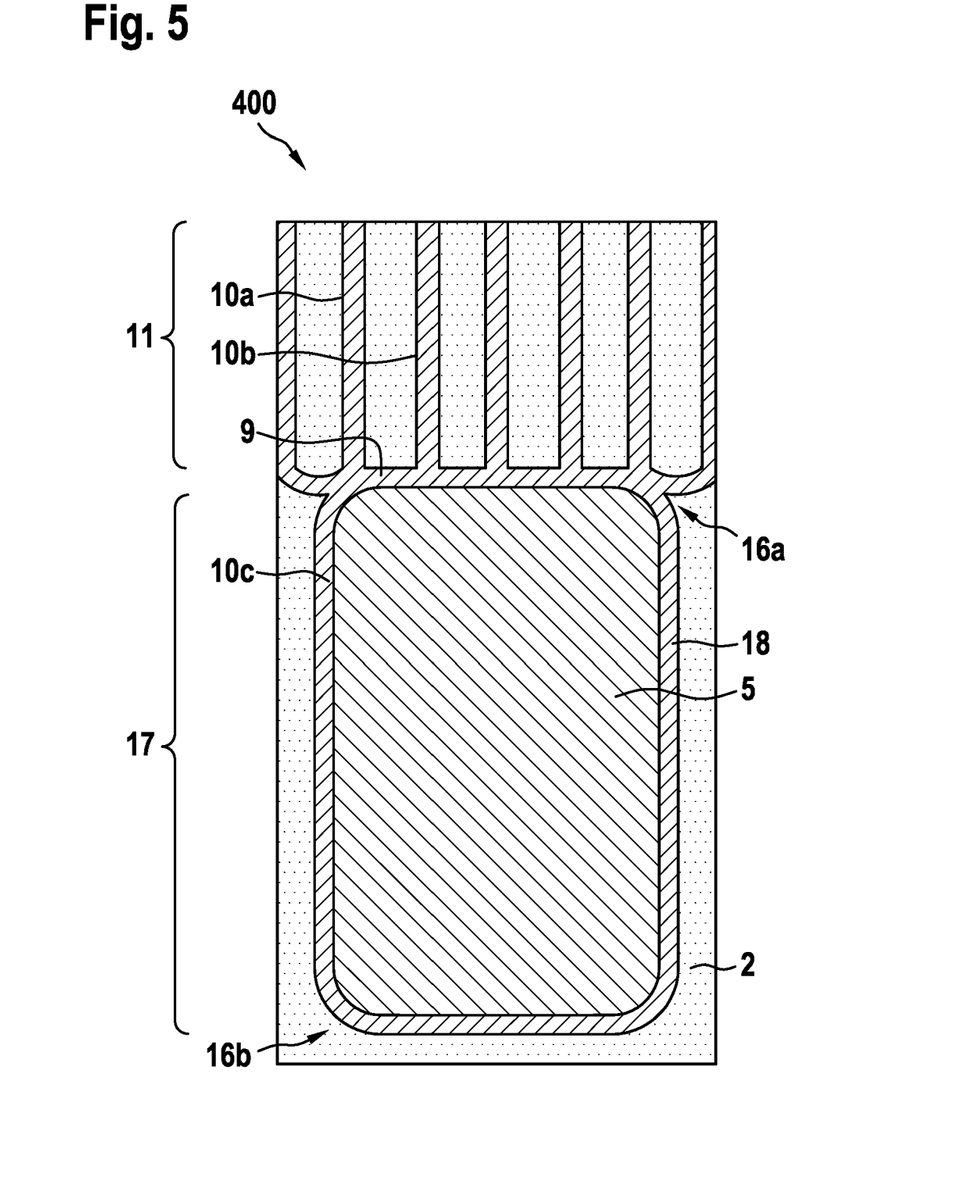
FIG. 5 schematically shows a top view of a trench transistor according to a fourth specific embodiment of the present invention.

FIG. 5 schematically shows a top view of a trench transistor 400 in a semiconductor region 2. A plurality of trench structures 10a, 10b are provided in trench transistor 400, which each include an insulation layer (not shown, see, for example, FIG. 1 or 2) and an electrically conductive gate layer 5 in the trenches. In an edge area 11 of first and second trench structures 10a, 10b, first and second trench structures 10a, 10c are connected to a trough 18, thus an area in which a plurality of trench structures 10a, 10b end in the lateral direction, in an edge area 17 of transistor 400. Trench structures 10a, 10b are connected for illustration at edge area 17 of transistor 400 to a wide area, i.e., trough 18, whose surface is approximately located at trench base height. Trough 18 includes a base surface at trench base height and a trough wall area around the base surface. Trough 18 is filled using an electrically conductive gate layer 5, for example, a polysilicon layer. Electrically conductive layer 5 in trough 18 is electrically connected to electrically conductive gate layers 5 in first and second trench structures 10a, 10b. Gate layer 5 and gate layers 5 in trench structures 10a, 10b may be the same layer. The contact between electrically conductive gate layer 5 and a gate contact (not shown; see, for example, contact 6 in FIG. 1 or 2), is established with the aid of trough 18 filled using electrically conductive layer 5. A gate insulation layer (not shown; see, for example, layer 3 or 4 in FIG. 1 or 2) is provided between the base surface and electrically conductive gate layer 5 in trough 18. Trough 18 represents a wide third trench structure having a slightly increased radius of curvature 16b in comparison to a radius of curvature 16a of first and second trench structures 10a, 10b.

According to a further aspect, trench transistor 400 may optionally have the above-described oxide thickening for an optimized protective effect, for example, in such a way that a thickness of the gate insulation layer is increased in an outer area of edge area 17 of trough 18. A field strength in the gate oxide in edge area 17 is reduced by the enlargement of the gate insulation layer in edge area 17.

Figure 6:
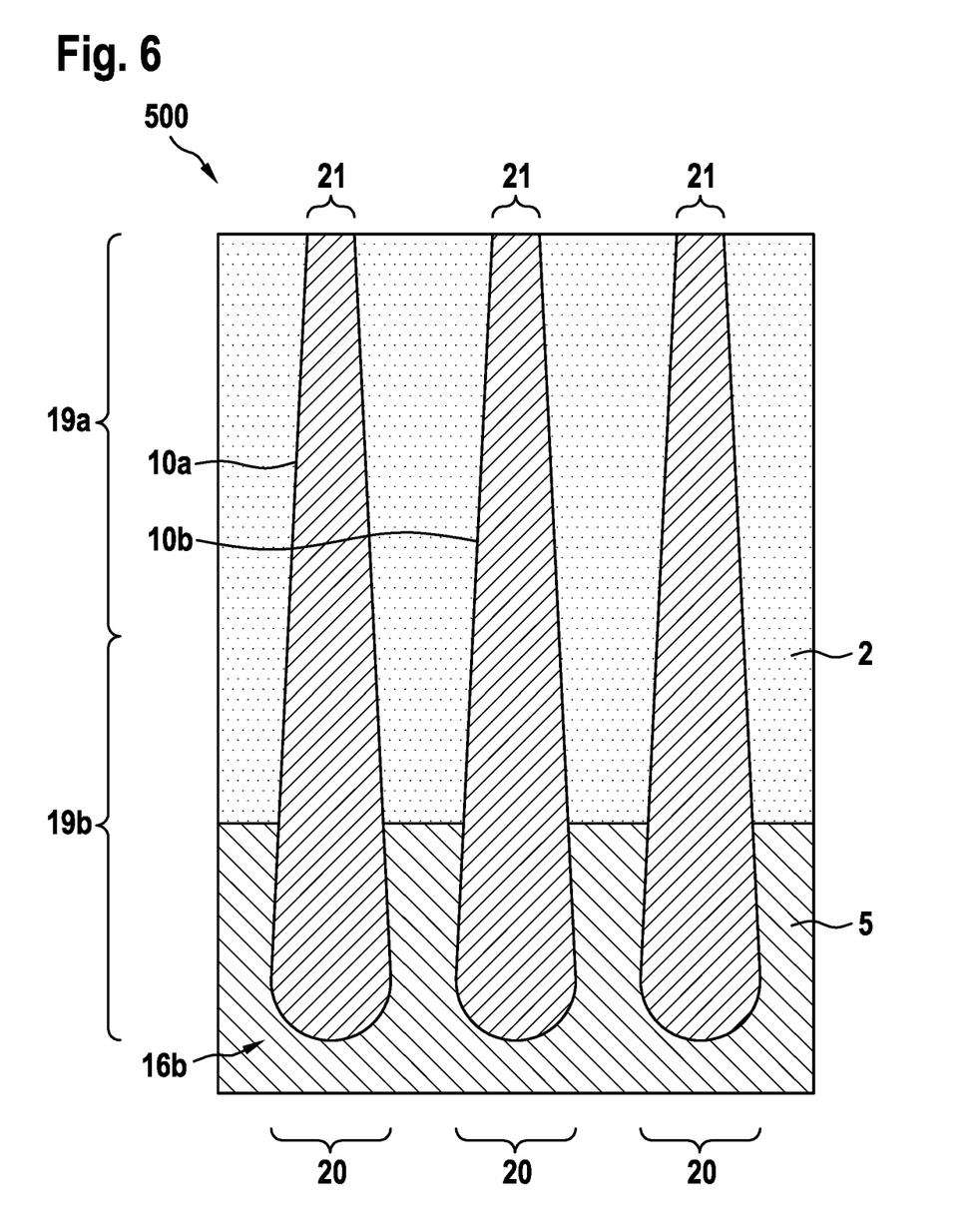
FIG. 6 schematically shows a top view of a trench transistor according to a fifth specific embodiment of the present invention.

FIG. 6 schematically shows a top view of a trench transistor 500. Transistor 500 includes a plurality of trench structures 10a, 10b in a semiconductor region 2. A gate insulation layer and an electrically conductive gate layer 5 thereon are formed in each of trench structures 10a, 10b. A width 21 in a first area 19a of trench structures 10a, 10b increases toward a width 20 in an edge area 19b of trench structures 10a, 10b. In edge area 19b, electrically conductive layer 5 is connected to a gate contact (not shown; see, for example, gate contact 6 in FIG. 1 or 2). Due to the increase in width, a radius of curvature 16b of trench structures 10a, 10b increases in edge area 19b.

According to a further aspect, the width of trench structures 10a, 10b may increase continuously, i.e., steadily, from a starting width 21 to an end width 20 of trench structures 10a, 10b.

According to a further aspect, the structure of trench transistor 500 described in reference to FIG. 6 may be combined with any further structure of a trench transistor described herein or with any of the further structures of trench transistors described herein.

What is claimed is:

1. A trench transistor, comprising:
   a semiconductor region;
   a trench structure formed in the semiconductor region;
   a gate insulation layer and an electrically conductive gate layer formed on the gate insulation layer in the trench structure; and
   a gate contact, which is electrically conductively connected to the electrically conductive gate layer in an edge area of the trench transistor, a thickness of the gate insulation layer in the edge area of the trench transistor being greater than a thickness in an active area of the trench transistor,
   wherein a width of the trench structure increases continuously from the active area of the trench transistor to the edge area of the trench transistor.

2. The trench transistor as recited in claim 1, wherein the electrically conductive gate layer in the edge area of the trench transistor extends out of the trench structure over the semiconductor region.

3. The trench structure as recited in claim 2, further comprising:
   a second trench structure and a second gate insulation layer in the second trench structure;
   wherein the electrically conductive gate layer is furthermore formed on the second gate insulation layer in the second trench structure, and a thickness of the second gate insulation layer in the edge area of the trench transistor is greater than the thickness in the active area of the trench transistor.

4. A trench transistor, comprising:
   a semiconductor region;
   a first trench structure and a second trench structure in the semiconductor region;

a trench connecting structure in the semiconductor region, which connects an edge area of the first trench structure and an edge area of the second trench structure to one another;

a third trench structure in the semiconductor region, which is connected to the trench connecting structure;

a gate insulation layer in the trench structures and the trench connecting structure;

an electrically conductive gate layer in the first, second, and third trench structures and the trench connecting structure; and a gate contact, which is electrically conductively connected to the electrically conductive gate layer in the third trench structure, at least at an edge area of the third trench structure, a width of the third trench structure being greater than a width of the first trench structure and/or a width of the second trench structure, wherein the third trench structure includes a first area and a second area, a width of the first area increasing toward the second area up to a width of the second area.

5. The trench transistor as recited in claim 4, further comprising:

an insulation layer above the semiconductor region; and an electrical through-contact through the insulation layer, which is connected to the electrically conductive gate layer in the third trench structure.

6. The trench transistor as recited in claim 4, wherein at the edge area of the third trench structure, a radius of curvature of the third trench structure is greater than a radius of curvature of the first trench structure at an edge area of the first trench structure and/or than a radius of curvature of the second trench structure at an edge region of the second trench structure.

7. The trench transistor as recited in claim 4, wherein the third trench structure is situated on a center line between the first trench structure and the second trench structure in an edge area of the trench transistor.

8. The trench transistor as recited in claim 4, wherein the third trench structure is formed in parallel to the first trench structure and the second trench structure and extends in extension of the first trench structure or the second trench structure in an edge area of the trench transistor.

9. The trench transistor as recited in claim 8, wherein the electrically conductive gate layer completely fills the third trench structure and extends out of the third trench structure over the semiconductor region.

10. A trench transistor, comprising:

a semiconductor region;

a plurality of trench structures situated adjacent to one another in the semiconductor region;

a trough in the semiconductor region connected in an edge area of the trench transistor to the plurality of trench structures;

a gate insulation layer and an electrically conductive gate layer formed on the gate insulation layer in the trench structures and in the trough; and a gate contact, which is electrically conductively connected to the electrically conductive gate layer in the trough, the trough extending at least from a first outermost trench structure of the plurality of trench structures laterally up to a second outermost trench structure of the plurality of trench structures, which is farthest away from the first outermost trench structure, wherein the width of the trench structure increases continuously from the active area of the trench transistor to the edge area of the trench transistor.

11. A trench transistor, comprising:

a semiconductor region;

a trench structure formed in the semiconductor region;

a gate insulation layer and an electrically conductive gate layer formed on the gate insulation layer in the trench structure; and a gate contact, which is electrically conductively connected to the electrically conductive gate layer in an edge area of the trench transistor, a width of the trench structure being greater in the edge area of the trench transistor than in an active area of the trench transistor, wherein the width of the trench structure increases continuously from the active area of the trench transistor to the edge area of the trench transistor.

\* \* \* \* \*